United States Patent
Arae et al.

(10) Patent No.: US 10,236,304 B2
(45) Date of Patent: Mar. 19, 2019

(54) GAS BARRIER LAMINATE, SEMICONDUCTOR DEVICE, DISPLAY ELEMENT, DISPLAY DEVICE, AND SYSTEM

(71) Applicants: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(72) Inventors: Sadanori Arae, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Minehide Kusayanagi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 30 days.

(21) Appl. No.: 15/369,678

(22) Filed: Dec. 5, 2016

(65) Prior Publication Data
US 2017/0162601 A1   Jun. 8, 2017

(30) Foreign Application Priority Data
Dec. 8, 2015  (JP) .................. 2015-239180

(51) Int. Cl.
*H01L 27/00*  (2006.01)
*H01L 27/12*  (2006.01)
*H01L 29/786* (2006.01)

(52) U.S. Cl.
CPC .... *H01L 27/1218* (2013.01); *H01L 29/78603* (2013.01)

(58) Field of Classification Search
CPC .............. H01L 27/1218; H01L 29/78603
See application file for complete search history.

(56) References Cited

U.S. PATENT DOCUMENTS

| | | | |
|---|---|---|---|
| 6,369,871 B1 * | 4/2002 | Hanada | G02F 1/1333 349/158 |
| 9,112,039 B2 | 8/2015 | Ueda et al. | |
| 2014/0127518 A1 * | 5/2014 | Ishikawa | H01L 51/5253 428/447 |
| 2014/0147684 A1 * | 5/2014 | Kwak | C09D 5/00 428/447 |
| 2015/0349138 A1 | 12/2015 | Sone et al. | |

(Continued)

FOREIGN PATENT DOCUMENTS

| JP | 2005329680 A | 12/2005 |
|---|---|---|
| JP | 2006-123307 | 5/2006 |

(Continued)

OTHER PUBLICATIONS

English translation of Taiwanese office action; Appl No. 105140431.

*Primary Examiner* — Muhammad N Edun
(74) *Attorney, Agent, or Firm* — Duft & Bornsen, PC

(57) ABSTRACT

A gas barrier laminate includes a substrate and a barrier layer formed on at least one of faces of the substrate. The barrier layer includes composite oxide including silicon and alkaline-earth metal.

9 Claims, 11 Drawing Sheets

(56) References Cited

U.S. PATENT DOCUMENTS

| | | |
|---|---|---|
| 2016/0013215 A1 | 1/2016 | Ueda et al. |
| 2016/0042947 A1 | 2/2016 | Nakamura et al. |
| 2016/0049611 A1* | 2/2016 | Yamada .............. H01L 51/5253 257/40 |
| 2016/0190329 A1 | 6/2016 | Matsumoto et al. |
| 2016/0267873 A1 | 9/2016 | Saotome et al. |
| 2016/0279939 A1 | 9/2016 | Arae et al. |

FOREIGN PATENT DOCUMENTS

| | | |
|---|---|---|
| JP | 2014-107527 | 6/2014 |
| JP | 2015-046568 | 3/2015 |
| JP | 2015-111653 | 6/2015 |
| JP | 2016-029716 | 3/2016 |

* cited by examiner

LIGHT

GAS BARRIER LAMINATE, SEMICONDUCTOR DEVICE, DISPLAY ELEMENT, DISPLAY DEVICE, AND SYSTEM

CROSS-REFERENCE TO RELATED APPLICATIONS

The present application claims the benefit of priority under 35 U.S.C. § 119 of Japanese Patent Application No. 2015-239180 filed on Dec. 8, 2015, the entire contents of which are incorporated herein by reference.

BACKGROUND OF THE INVENTION

1. Field of the Invention

The disclosures herein generally relate to a gas barrier laminate, a semiconductor device, a display element, a display device, and a system.

2. Description of the Related Art

A high level of gas barrier property is demanded for the substrate in the fields of electronic devices such as displays, lighting devices, and solar batteries, in addition to several physical properties including transparency, heat resistance, solvent resistance, and interlayer adhesion. For this reason, the provision of a barrier layer having a gas barrier property between the substrate and a semiconductor element is studied.

As an example of obtaining a gas barrier property, there is a technique of depositing a resin layer containing a main component of polyorganosilsesquioxane on at least one of plastic films, and forming an inorganic compound layer including any one of silicon oxide, silicon oxide/nitride, oxidized silicon carbide, silicon carbide, silicon nitride, and silicon dioxide in the resin layer, so as to obtain a gas barrier laminate (for example, see Japanese Unexamined Patent Application Publication No. 2006-123307).

SUMMARY OF THE INVENTION

In one embodiment, a gas barrier laminate includes a substrate and a barrier layer formed on at least one of faces of the substrate. The barrier layer includes composite oxide including silicon and alkaline-earth metal.

DESCRIPTION OF THE PREFERRED EMBODIMENTS

Figure 1:
FIG. 1 is a cross-sectional view of a gas barrier laminate in a first embodiment.

It is a general object of at least one embodiment of the present invention to provide a gas barrier laminate, a semiconductor device, a display element, a display device, and a system that substantially obviate one or more problems caused by the limitations and disadvantages of the related art.

In the following, embodiments of the present invention will be described with reference to the accompanying drawings. In the drawings, identical components have identical numerical references, and overlapping description is omitted, in some cases.

First Embodiment

<Gas Barrier Laminate>

FIG. 1 is a cross-sectional view of a gas barrier laminate in a first embodiment. Referring to FIG. 1, a gas barrier laminate 10 includes a substrate 11, and a barrier layer 12.

The substrate 11 is an insulating member, and serves as a base body for forming the barrier layer 12. The shape, structure, and size of the substrate 11 are not particularly limited, and may be selected for the purpose as needed. The material of the substrate 11 is not particularly limited. The material of the substrate 11 may be either a rigid material or a flexible material (i.e. a material having flexibility), and may be selected for the purpose as needed. Specific examples will be given as follows.

For example, a glass substrate or a plastic substrate can be used for the substrate 11. There is no particular limitation to the glass substrate, and any glass substrate may be selected for the purpose as needed. Examples of the glass substrate may include, but are not limited to, alkali-free glass, and silica glass. There is no particular limitation to the plastic substrate, and any plastic substrate may be selected for the purpose as needed. Examples of the plastic substrate may include, but are not limited to, polycarbonate (PC), polyimide (PI), polyethylene terephthalate (PET), and polyethylene naphthalate (PEN).

The barrier layer 12 is formed on at least one of faces of the substrate 11. The barrier layer 12 may be formed on both faces of the substrate 11. The barrier layer 12 is a layer that blocks the flow of gas (i.e., gaseous substance) such as oxygen or water vapor. For example, when semiconductor elements are mounted on the barrier layer 12, the barrier layer 12 prevents oxygen or water vapor from reaching the semiconductor elements from the substrate 11 side. There is no particular limitation to the average thickness, and any average thickness of the barrier layer 12 may be selected for the purpose as needed.

The barrier layer 12 includes composite oxide containing silicon and alkaline-earth metal. Such a barrier layer 12 improves the linear expansion coefficient more than the linear expansion coefficient of a known barrier layer including $SiO_2$. Therefore, the barrier layer 12 is achieved that hardly suffers from minute defects such as cracks, peelings, and pin holes, which are caused by, for example, expansion and contraction of the substrate 11 in accordance with a change in temperature. In addition, as being excellent in transparency and heat resistance, the composite oxide including silicon and alkaline-earth metal is applicable to a semiconductor device, for example, a thin-film transistor.

The alkaline-earth metal included in the composite oxide can be, for example, at least one of Al, B, Mg, Ca, Sr, and Ba. Alternatively, the composite oxide can include some (or all) Al, B, Mg, Ca, Sr, and Ba. The composite oxide may include at least one of Al and B.

<Field-Effect Transistor>

Herein, as an example of using a gas barrier laminate, a field-effect transistor produced on the gas barrier laminate will be described.

Figure 2:
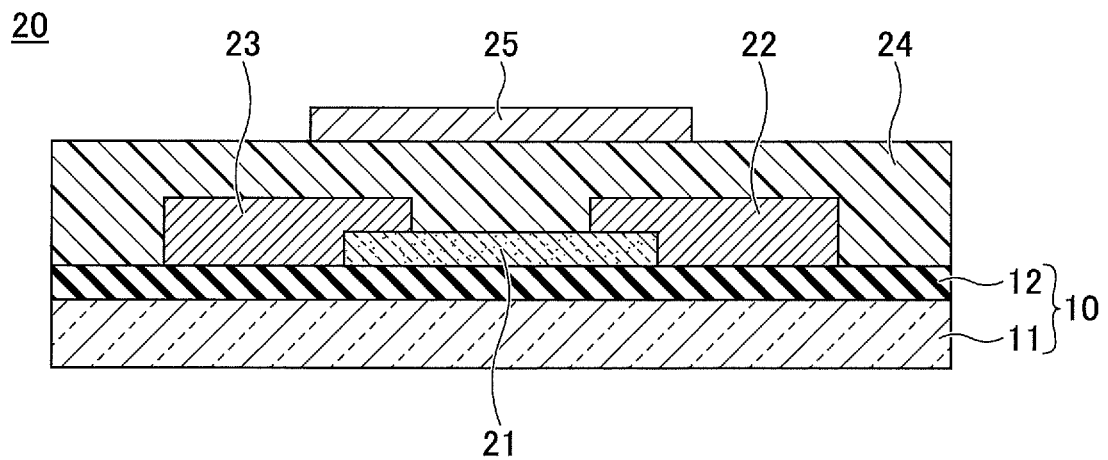
FIG. 2 is a cross-sectional view of a field-effect transistor in the first embodiment.

FIG. 2 is a cross-sectional view of a field-effect transistor in the first embodiment. Referring to FIG. 2, a field-effect transistor 20 includes a gas barrier laminate 10, an active layer 21, a source electrode 22, a drain electrode 23, a gate insulating layer 24, and a gate electrode 25. The field-effect transistor 20 is a top-gate top-contact field-effect transistor. Note that the field-effect transistor 20 is a representative example of the semiconductor device in one or more embodiments.

In the field-effect transistor 20, the active layer 21 is formed on the barrier layer 12 having an insulating property, in the gas barrier laminate 10. The source electrode 22 and the drain electrode 23 are formed on the active layer 21 so as to form a channel in the active layer 21. The gate insulating layer 24 is formed to cover the active layer 21, the source electrode 22, and the drain electrode 23. The gate electrode 25 is formed on the gate insulating layer 24. Hereinafter, the component elements of the field-effect transistor 20 will be described in detail.

In the present embodiment, for the sake of simplicity, the gate electrode 25 side is referred to as an upper side or a first side, whereas the substrate 11 side is referred to as a lower side or a second side. In addition, the face on the gate electrode 25 side in each layer is referred to as an upper side or a first side, whereas the face on the substrate 11 side is referred to as a lower side or a second side. The field-effect transistor 20 can also be used upside down, or can be arranged at any angle. In addition, a planar view means a view when a target object is viewed in the normal direction of the upper face of the substrate 11. A planar shape means a shape when the target object is viewed in the normal direction of the upper face of the substrate 11. Further, a longitudinal section means a section taken along a stacked direction of the layers on the substrate 11. A transverse section means a section taken along a perpendicular direction to the stacked direction of the layers on the substrate 11 (i.e., a direction parallel to top face of the substrate 11).

The active layer 21 is formed in a given region of the barrier layer 12. The active layer 21 can be a layer including, for example, an oxide semiconductor. With regard to oxide semiconductor, for example, an n-type oxide semiconductor can be used. In this case, there is no particular limitation to the n-type oxide semiconductor, and any n-type oxide semiconductor may be selected for the purpose as needed. Examples of the n-type oxide semiconductor may include, but are not limited to, an Mg—In based oxide semiconductor and an In based oxide semiconductor. There is no particular limitation to the average thickness, and any average thickness of the active layer 21 may be selected for the purpose as needed. The average thickness of the active layer 21 may be 1 nanometer to 200 nanometers. The average thickness of the active layer 21 may be 5 nanometers to 100 nanometers.

The source electrode 22 and the drain electrode 23 are formed on the barrier layer 12. The source electrode 22 and the drain electrode 23 partially cover the active layer 21. The source electrode 22 and the drain electrode 23 are spaced apart from each other at a given interval for a channel region. The source electrode 22 and the drain electrode 23 make electrical current available in accordance with the gate voltage applied to the gate electrode 25. Together with the source electrode 22 and the drain electrode 23, interconnections to be respectively coupled to the source electrode 22 and the drain electrode 23 are formed on the same layer.

There is no particular limitation to the materials for the source electrode 22, the drain electrode 23, and the interconnections, and any material may be selected for the purpose as needed. Examples of the material may include, but are not limited to, metals such as Al, Au, Pt, Pd, Ag, Cu, Zn, Ni, Cr, Ta, Mb, Ti, alloys of these metals, and mixtures of these metals. Alternatively, conductive oxide such as indium oxide, zinc oxide, tin oxide, gallium oxide, niobium oxide, a complex compound of those conductive oxides, or a mixture of those oxides can be used.

There is no particular limitation to the average thicknesses of the source electrode 22, the drain electrode 23, and the interconnections, and any average thickness may be selected for the purpose as needed. The average thicknesses of the source electrode 22, the drain electrode 23, and the interconnections may be 40 nanometers to 2 micrometers. The average thicknesses of the source electrode 22, the drain electrode 23, and the interconnections may be 70 nanometers to 1 micrometer.

The gate insulating layer 24 covers the active layer 21, the source electrode 22, and the drain electrode 23. The gate insulating layer 24 is formed over the barrier layer 12. The gate insulating layer 24 insulates the source electrode 22 and the drain electrode 23 from the gate electrode 25. The material of the gate insulating layer 24 is not particularly limited, and any material may be selected for the purpose as needed. For example, an inorganic insulating material or an organic insulating material can be used.

Examples of the inorganic insulating material may include, but are not limited to, silicon oxide, alumina, tantalum oxide, titanium oxide, yttrium oxide, lanthanum oxide, hafnium oxide, zirconium oxide, silicon nitride, aluminum nitride, and mixtures of the above materials. Examples of the organic insulating material may include, but are not limited to, polyimide, polyamide, polyacrylate, polyvinyl alcohol, and novolak resin. The average thickness of the gate insulating layer 24 is not particularly limited, and any average thickness may be selected for the purpose as needed. The average thickness of the gate insulating layer 24 may be 50 nanometers to 3 micrometers. The average thickness of the gate insulating layer 24 may be 100 nanometers to 1 micrometer.

The barrier layer 12 included in the gas barrier laminate 10 is an insulating layer, and the gate insulating layer 24 may have the same composition as the composition of the barrier layer 12. To be specific, the gate insulating layer 24 may include composite oxide including silicon and alkaline-earth metal.

The barrier layer 12 is in partial contact with the gate insulating layer 24. Both the barrier layer 12 and the gate insulating layer 24 having the same composition improve the adhesion property between the barrier layer 12 and the gate insulating layer 24. In addition, both the barrier layer 12 and the gate insulating layer 24 having the same composition reduce a possibility of a defect produced at a boundary between the barrier layer 12 and the gate insulating layer 24. In particular, in a top-gate field-effect transistor, the barrier layer 12 and the gate insulating layer 24 completely cover the active layer 21. The gas barrier property to block the flow of the active layer 21 is improved, accordingly.

The gate electrode 25 is stacked above the active layer 21 through the gate insulating layer 24. The gate electrode 25 applies a gate voltage. The material of the gate electrode 25 is not particularly limited, and any material may be selected for the purpose as needed. For example, the same material as the material of the source electrode 22 or the drain electrode 23 can be used. The average thickness of the gate electrode 25 is not particularly limited, and any average thickness may be selected for the purpose as needed. The average thickness of the gate electrode 25 may be 40 nanometers to 2 micrometers. The average thickness of the gate electrode 25 may be 70 nanometers to 1 micrometer.

<Method for Manufacturing Field-Effect Transistor>

Next, a method for manufacturing the field-effect transistor illustrated in FIG. 2 will be described. FIG. 3A to FIG. 3E are views of the processes for manufacturing the field-effect transistor in the first embodiment.

Figure 3A:
FIG. 3A to FIG. 3E are views of the processes for manufacturing the field-effect transistor in the first embodiment.

Firstly, in the process of FIG. 3A, the gas barrier laminate 10 is produced. To be specific, the substrate 11 including a glass substrate or a plastic substrate is prepared at first. Then, the barrier layer 12 including the composite oxide including silicon and alkaline-earth metal is formed on the substrate 11. To form the barrier layer 12, for example, a coating liquid of the composite oxide including silicon and alkaline-earth metal is produced. The coating liquid is applied on the substrate 11. Then, drying and baking processes are conducted at given temperatures. In order to clean the surface of the substrate 11 and improve the adhesion property of the substrate 11, preprocessing using oxygen plasma or ultraviolet ozone, or ultraviolet irradiation cleaning may be conducted before the barrier layer 12 is formed.

Figure 3B:
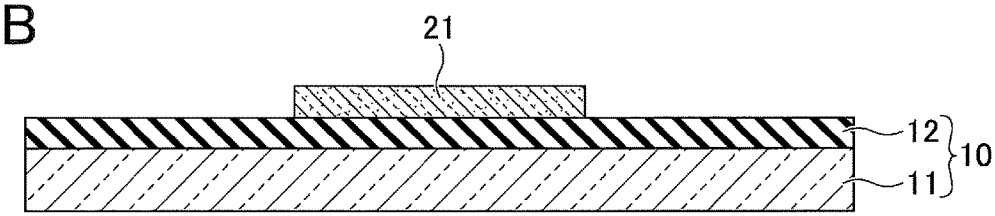

Next, in the process of FIG. 3B, the active layer 21 is formed on the barrier layer 12 of the gas barrier laminate 10. In order to form the active layer 21, firstly, a layer including an oxide semiconductor is formed on the active layer 21 by sputtering, for example. The material of the oxide semiconductor can be selected for the purpose as needed, as described above. For example, an Mg—In based oxide semiconductor can be used. When the Mg—In based oxide semiconductor is used for the oxide semiconductor, for example, a polycrystalline fired body including a composition of $In_2MgO_4$ can be used for a target. In addition, the arrived vacuum degree in a sputtering chamber or the flow rates of argon gas and oxygen gas flowing at the time of sputtering may be adjusted for a suitable total pressure. After the oxide semiconductor is formed on the substrate 11, the oxide semiconductor is patterned by, for example, photolithography and etching. The active layer 21 having a predetermined shape is formed.

Figure 3C:
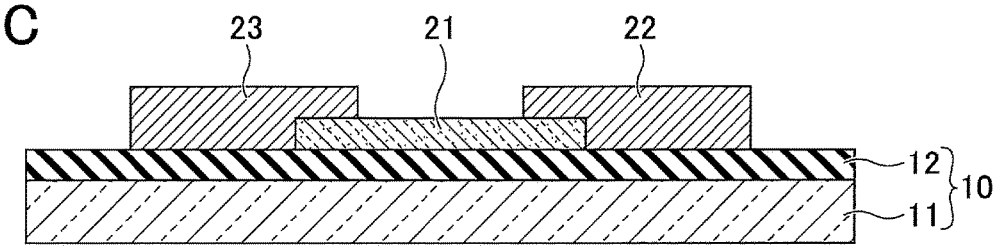

In the process of FIG. 3C, the source electrode 22 and the drain electrode 23 are formed on the active layer 21. In order to form the source electrode 22 and the drain electrode 23, a metal film that covers the active layer 21 is firstly formed on the barrier layer 12 by a vacuum deposition method. Then, the metal film that has been formed is patterned by, for example, photolithography and etching. The source electrode 22 and the drain electrode 23 having predetermined shapes are formed.

The materials of metals that are formed to be the source electrode 22 and the drain electrode 23, and the thickness of the source electrode 22 or the drain electrode 23, can be selected as needed, as described above. In this process, the interconnections to be coupled to the source electrode 22 and the drain electrode 23 are also formed on the active layer 21, together with the source electrode 22 and the drain electrode 23.

Figure 3D:
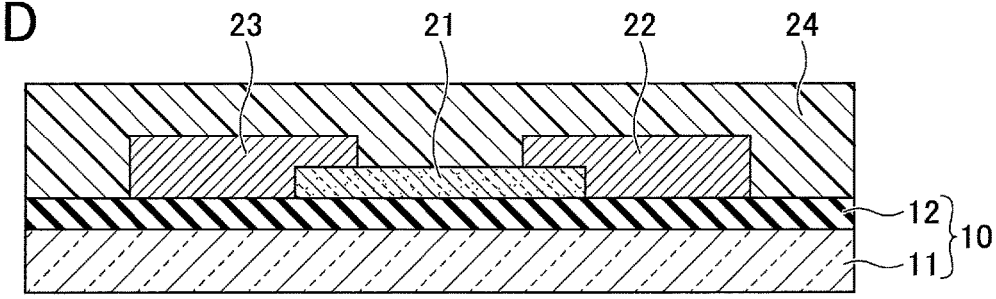

Next, in the process of FIG. 3D, the gate insulating layer 24 is formed on the barrier layer 12. The gate insulating layer 24 covers the active layer 21, the source electrode 22, and the drain electrode 23. The gate insulating layer 24 can be formed by, for example, a plasma Chemical Vapor Deposition (CVD) method. The material and the thickness of the gate insulating layer 24 can be selected as needed, as described above.

Figure 3E:
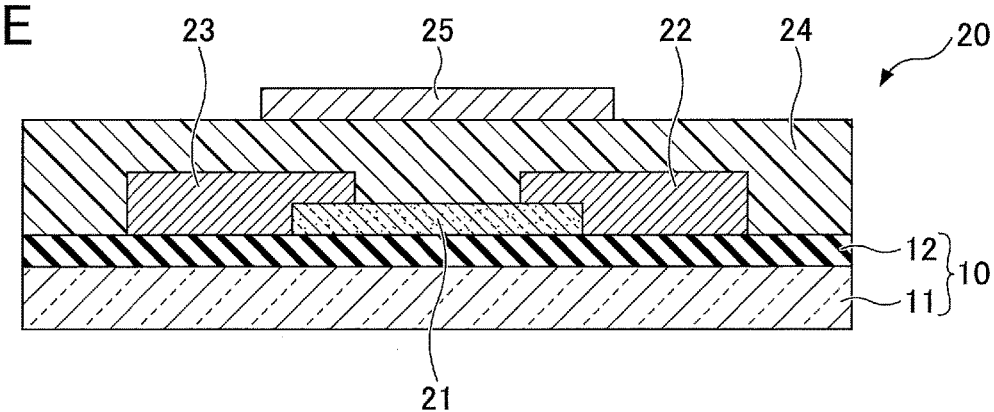

Next, in the process of FIG. 3E, the gate electrode 25 is formed on the gate insulating layer 24. In order to form the gate electrode 25, a metal film is firstly formed on the gate insulating layer 24 by, for example, a vacuum deposition method. Then, the metal film that has been formed is patterned by, for example, photolithography and etching. The gate electrode 25 having a predetermined shape is formed. The material and the thickness of the gate electrode 25 can be selected as needed, as described above.

In the above-described processes, the field-effect transistor 20 of a top-gate top-contact type illustrated in FIG. 2 can be manufactured.

As described above, in the field-effect transistor 20 in the first embodiment, the layers including the active layer 21 are formed on the gas barrier laminate 10. This configuration prevents oxygen or water vapor from reaching the active layer 21 side from the substrate 11 side. As a result, performance degradation of the field-effect transistor 20 is prevented.

In addition, the barrier layer 12 includes the composite oxide including silicon and alkaline-earth metal. This configuration improves the linear expansion coefficient more than the linear expansion coefficient of a known barrier layer made $SiO_2$ and other materials. This configuration also achieves the barrier layer 12 that hardly suffers from minute defects such as cracks, peelings, and pin holes, which are caused by, for example, expansion and contraction of the substrate 11 in accordance with a change in temperature. As a result, degradation in the gas barrier property of the barrier layer 12 is prevented over time. The performance of the field-effect transistor 20 is maintained for a long time.

Further, also in a case where the substrate 11 is a flexible film-shaped substrate, the barrier layer 12 has a high linear expansion coefficient, and follows the expansion and contraction of the substrate 11. Therefore, the barrier layer 12 hardly suffers from a minute defect. As a result, degradation in the gas barrier property of the barrier layer 12 is prevented over time. The performance of the field-effect transistor 20 is maintained for a long time.

Variations of First Embodiment

In variations of the first embodiment, examples of the field-effect transistor having different layer structures from the structure of the field-effect transistor in the first embodiment will be described. In variations of the first embodiment, descriptions of same components as the components that have been described above are omitted, in some cases.

Figure 4:
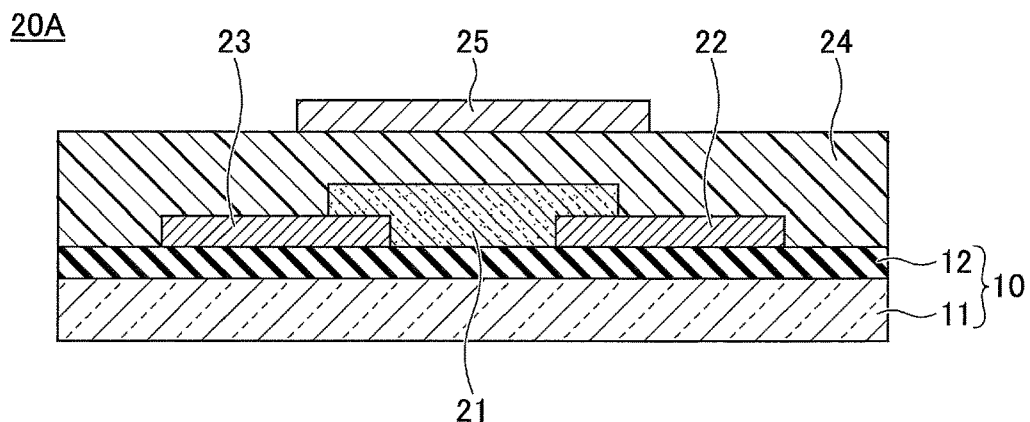
FIG. 4 is a first cross-sectional view of the field-effect transistor in a variation of the first embodiment.
Figure 5:
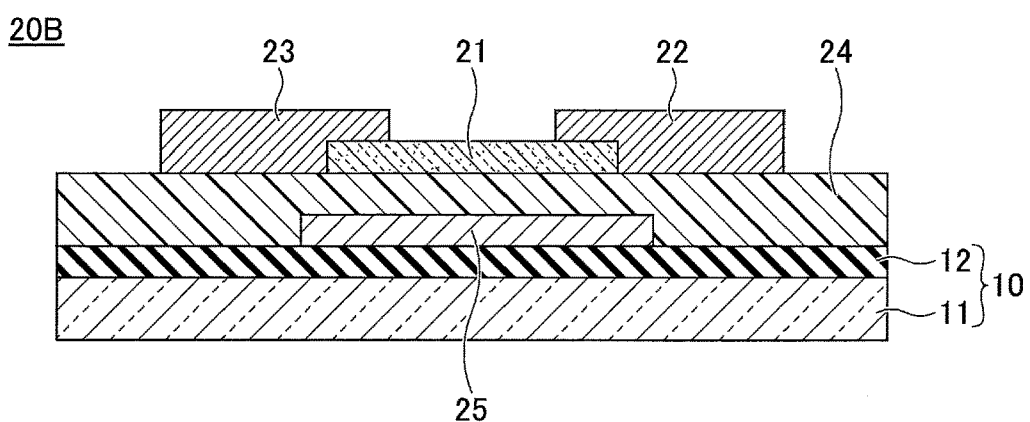
FIG. 5 is a second cross-sectional view of the field-effect transistor in another variation of the first embodiment.
Figure 6:
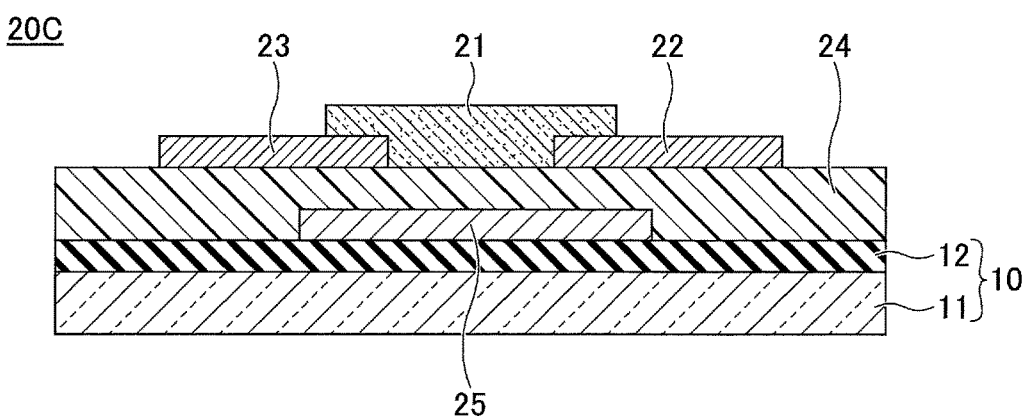
FIG. 6 is a third cross-sectional view of the field-effect transistor in yet another variation of the first embodiment.

FIG. 4 to FIG. 6 are cross-sectional views of the field-effect transistors in variations of the first embodiment.

A field-effect transistor 20A illustrated in FIG. 4 is a top-gate bottom-contact field-effect transistor. A field-effect transistor 20B illustrated in FIG. 5 is a bottom-gate top-contact field-effect transistor. A field-effect transistor 20C illustrated in FIG. 6 is a bottom-gate bottom-contact field-effect transistor. The field-effect transistors 20A to 20C are representative examples of the semiconductor devices in variations of the first embodiment.

The field-effect transistor formed on the gas barrier laminate 10 is not limited to a top-gate top-contact field-effect transistor, and may be a top-gate bottom-contact field-effect transistor, a bottom-gate top-contact field-effect transistor, or a bottom-gate bottom-contact field-effect transistor. Also in those cases, the same advantages as the first embodiment are achievable.

Examples 1 to 4

In each one of Examples 1 to 4, the barrier layer 12 of the gas barrier laminate 10 illustrated in FIG. 1 is produced to have a different composition. In Examples 1 to 4 below, "%" represents "percent by mass", if not otherwise specified.

<Production of Coating Liquid Used for Forming Barrier Layer 12>

The amounts indicated in Table 1 were mixed into a solution containing Tetramethoxysilane (T5702-100G, Aldrich), aluminum (s-butoxide) diacetoacid ester chelate (containing 8.4% of Al, Alfa89349, Alfa Aesar), boric acid triisopropyl (Wako320-41532, Wako Chemical Ltd.), 2-ethylhexanoic acid calcium mineral spirit solution (containing 5% of Ca, Wako351-01162, Wako Chemical Ltd.), and 2-ethylhexanoic acid strontium toluene solution (containing 2% of Sr, Wako 195-09561, Wako Pure Chemical Industries, Ltd.). The mixed solution was then diluted by toluene, and the coating liquid used for forming the barrier layer 12 was obtained. The composite oxide formed with the coating liquid used for forming the barrier layer 12 had compositions indicated in Table 1 below.

<Appearance Inspection>

The coating liquid of 0.4 milliliters used for forming the barrier layer 12 was applied on the substrate 11. Subsequently, a drying process was conducted in the air at 120 degrees Celsius for one hour. Then, a baking process was conducted under $O_2$ atmosphere at 400 degrees Celsius for three hours. The barrier layer 12 of a composite oxide film including $SiO_2$—$Al_2O_3$—$B_2O_3$—CaO—SrO was formed. The average thickness of the barrier layer 12 was approximately 30 nanometers. At the end, a heating process was conducted at 320 degrees Celsius for 30 minutes. Then, the appearance was evaluated. The results are indicated in Table 1 below.

<Formation of Capacitor for Measuring Relative Permittivity>

Firstly, a lower electrode was formed on the substrate. To be specific, a molybdenum (Mo) film was deposited by DC sputtering through a metal mask to have the average thickness of 100 nanometers. Then, the coating liquid used for forming the barrier layer 12 in each Example was used to form a dielectric layer in the same process as described above. At the end, an upper electrode was formed on the dielectric layer in the same process as the process of forming the lower electrode. Thus, a capacitor was formed. The dielectric layer had the average thickness of approximately 30 nanometers. The capacitor was formed as described above and then the relative permittivity was measured by an LCR meter (4284A, Agilent). The results are indicated in Table 1.

<Production of Sample for Measuring Linear Expansion Coefficient>

The coating liquid of one liter used for forming the barrier layer 12 in each Example was produced. The solvent was eliminated, a heating process was conducted in a Pt crucible at 1600 degrees Celsius, and melting occurred. Then, a columnar object having a diameter of 5 millimeters and a height of 10 millimeters was produced by a float method. The average linear expansion coefficient of the columnar object in a temperature range of 20 degrees Celsius to 300 degrees Celsius was measured by a thermal mechanical analyzer (8310 series, Rigaku Corporation). The produced columnar object had the same composition as the composition of a case where the coating liquid used for forming the barrier layer 12 was deposited on either one of the faces of the substrate, in each of Examples. The produced columnar object also had the same linear expansion coefficient. The results are indicated in Table 1.

TABLE 1

| OXIDE | EXAMPLE 1 | | EXAMPLE 2 | | EXAMPLE 3 | | EXAMPLE 4 | |
|---|---|---|---|---|---|---|---|---|
| | OXIDE MASS RATIO MASS % | OXIDE MOLE RATIO MOLE % | OXIDE MASS RATIO MASS % | OXIDE MOLE RATIO MOLE % | OXIDE MASS RATIO MASS % | OXIDE MOLE RATIO MOLE % | OXIDE MASS RATIO MASS % | OXIDE MOLE RATIO MOLE % |
| $SiO_2$ | 61.0 | 67.5 | 62.8 | 70.0 | 50.9 | 60.3 | 62.3 | 70.3 |
| $Al_2O_3$ | 16.4 | 10.7 | 18.1 | 11.9 | 12.3 | 8.6 | 21.5 | 14.3 |
| $B_2O_3$ | 12.3 | 11.8 | 12.8 | 12.3 | 10.8 | 11.1 | 13.7 | 13.4 |
| CaO | 6.2 | 7.4 | 3.2 | 3.8 | 3.7 | 4.7 | 0.7 | 0.8 |
| SrO | 4.0 | 2.6 | 3.1 | 2.0 | 22.3 | 15.3 | 1.8 | 1.2 |
| TOTAL | 100.0 | 100.0 | 100.0 | 100.0 | 100.0 | 100.0 | 100.0 | 100.0 |
| RELATIVE PERMITTIVITY | 5.5 | | 5.0 | | 6.0 | | 4.8 | |
| LINEAR EXPANSION COEFFICIENT ($\times 10^{-7}$/K) | 36.4 | | 30.0 | | 50.3 | | 24.7 | |
| APPEARANCE | NO PEELING | | NO PEELING | | NO PEELING | | NO PEELING | |

Comparison Example

<Appearance Inspection>

By using $SiCl_4$ as a material, a $SiO_2$ layer was formed on the substrate 11 by a Plasma Enhance Chemical Vapor Deposition (PECVD) process. The $SiO_2$ layer that was formed had the average thickness of approximately 30 nanometers. At the end, a heating process was conducted at 320 degrees Celsius for 30 minutes. Then, the appearance was evaluated. The results are indicated in Table 2 below.
<Formation of Capacitor for Measuring Relative Permittivity>

Firstly, a lower electrode was formed on the substrate. To be specific, a molybdenum (Mo) film was deposited by DC sputtering through a metal mask to have the average thickness of 100 nanometers. Then, a dielectric layer including a $SiO_2$ layer was formed in the same process as the process in each of Examples. At the end, an upper electrode was formed on the dielectric layer in the same process as the process of forming the lower electrode, and thus a capacitor was formed. The dielectric layer had the average thickness of approximately 30 nanometers. The capacitor was formed as described above and then the relative permittivity was measured by an LCR meter (4284A, Agilent). The results are indicated in Table 2 below.
<Production of Sample for Measuring Linear Expansion Coefficient>

By using $SiCl_4$ as a material, a hydrolysis process was conducted in oxyhydrogen flame to grow silica powder, and a $SiO_2$ porous body was obtained. Then, the $SiO_2$ porous body was melted at high temperature of 1600 degrees Celsius. Columnar $SiO_2$ glass having a diameter of 5 millimeters and a height of 10 millimeters was produced. The average linear expansion coefficient of the produced columnar $SiO_2$ glass in the temperature range of 20 degrees Celsius to 300 degrees Celsius was measured by the thermal mechanical analyzer (8310 series, Rigaku Corporation). The results are indicated in Table 2.

TABLE 2

| OXIDE | COMPARATIVE EXAMPLE | |
|---|---|---|
| | OXIDE MASS RATIO MASS % | OXIDE MOLE RATIO MOLE % |
| $SiO_2$ | 100.0 | 100.0 |
| $Al_2O_3$ | — | — |
| $B_2O_3$ | — | — |
| CaO | — | — |
| SrO | — | — |
| TOTAL | 100.0 | 100.0 |
| RELATIVE PERMITTIVITY | 3.9 | |
| LINEAR EXPANSION COEFFICIENT ($\times 10^{-7}$/K) | 5.0 | |
| APPEARANCE | PEELED | |

As indicated in Table 1 and Table 2, in the comparative example, the linear expansion coefficient was $5 \times 10^{-7}$/K and peeling occurred. However, in Examples 1 to 4, the linear expansion coefficient was $24.7 \times 10^{-7}$/K at the lowest and peeling did not occur.

In other words, the barrier layer 12 including the composite oxide including silicon and alkaline-earth metal has approximately five times or more the linear expansion coefficient of the $SiO_2$ layer in the comparative example. These results exhibit that the barrier layer 12 in Examples 1 to 4 hardly suffers from minute defects such as cracks, peelings, and pin holes, which are caused by, for example, expansion and contraction of the substrate in accordance with a change in temperature. In other words, the barrier layers 12 in Examples 1 to 4 are capable of preventing degradation in the gas barrier property.

Second Embodiment

In a second embodiment, examples of a display element, a display device, and a system, to each of which the field-effect transistor in the first embodiment is applied, will be described. In the second embodiment, descriptions of the same components as the components that have been described above are omitted, in some cases.
<Display Element>

The display element in the second embodiment includes at least an optical control element, and a driving circuit configured to drive the optical control element. In addition, the display element may include other members, as needed. There is no particular limitation to the optical control element. The optical control element may be any element that controls an optical output in response to a driving signal, and may be selected for the purpose as needed. Examples of the optical control element may include, but are not limited to, an electroluminescence (EL) element, an electrochromic (EC) element, a liquid crystal element, an electrophoresis element, and an electrowetting element.

There is no particular limitation to the driving circuit, and the driving circuit may be any circuit that includes the field-effect transistor in the first embodiment, and may be selected for the purpose as needed. There is no particular limitation to the other members, and the other members may be selected for the purpose as needed.

The display element in the second embodiment includes the field-effect transistor in the first embodiment. Therefore, degradation in gas barrier property is prevented over time. The performance of the field-effect transistor is maintained for a long time. As a result, high-quality display is enabled continuously.
<Display Device>

The display device in the second embodiment includes a plurality of display elements in the second embodiment, a plurality of interconnections, and a display controller. In addition, the display device may include other members, as needed. There is no particular limitation to the plurality of display elements, may be any display elements arranged in a matrix in the second embodiment, and may be selected for the purpose as needed.

There is no particular limitation to the plurality of interconnections. The plurality of interconnections may be any interconnections capable of individually applying a gate voltage and a visual data signal to the field-effect transistors in the display elements, and may be selected for the purpose as needed.

There is no particular limitation to the display controller, so the display controller may be any display controller capable of individually controlling the gate voltage and a signal voltage in each field-effect transistor through the plurality of interconnections, and may be selected for the purpose as needed. There is no particular limitation to the other members, and the other members may be selected for the purpose as needed.

The display device in the second embodiment includes the display element including the field-effect transistor in the first embodiment. Hence, high-quality display is enabled continuously.
<System>

The system in the second embodiment includes at least the display device in the second embodiment, and a visual data creator. The visual data creator creates visual data in accordance with information on an image to be displayed, and then outputs the visual data to the display device.

Since the system includes the display device in the second embodiment, high-definition display of the visual information is enabled.

Hereinafter, the display element, the display device, and the system will be described specifically.

Figure 7:
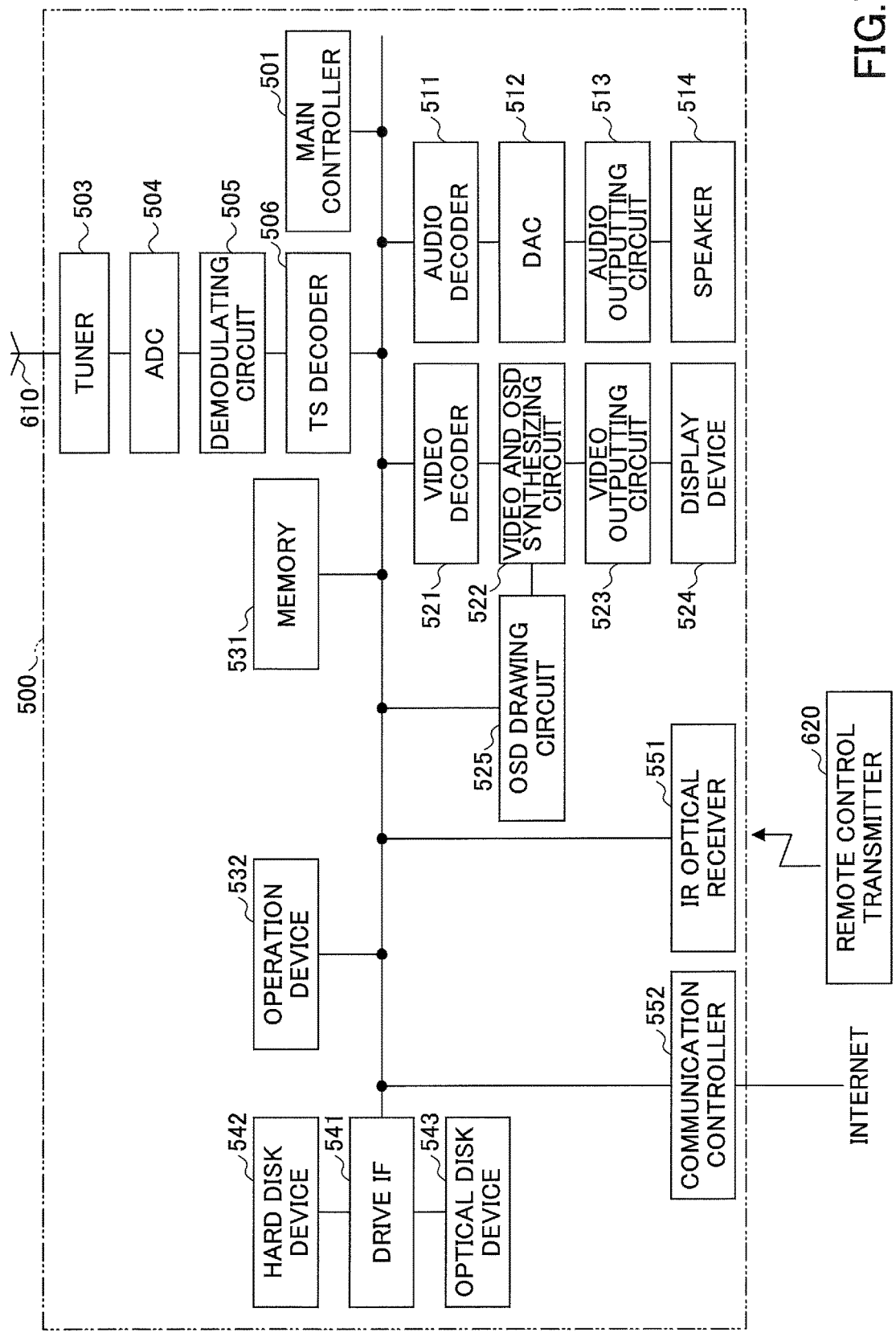
FIG. 7 is a block diagram of a configuration of a television apparatus in a second embodiment.

FIG. 7 illustrates an outline configuration of a television apparatus 500. The television apparatus 500 is an example of the system in the second embodiment. Connection lines in FIG. 7 indicate representative flows of signals and information, but do not indicate all of the connecting relationships between blocks.

The television apparatus 500 in the second embodiment includes a main controller 501, a tuner 503, an AD convertor (ADC) 504, a demodulating circuit 505, a Transport Stream (TS) decoder 506, an audio decoder 511, a DA converter (DAC) 512, an audio outputting circuit 513, a speaker 514, a video decoder 521, a video and OSD synthesizing circuit 522, a video outputting circuit 523, a display device 524, an OSD drawing circuit 525, a memory 531, an operation device 532, a drive interface (drive IF) 541, a hard disk device 542, an optical disk device 543, an IR optical receiver 551, and a communication controller 552.

The main controller 501 controls the entire television apparatus 500. The main controller 501 includes a CPU, a flash ROM, a RAM, and some other components. Programs written in readable codes on the CPU and various data used for the processes on the CPU are stored in the flash ROM. The RAM is a working memory.

The tuner 503 selects a broadcast of a predetermined channel from broadcast waves that have been received by an antenna 610. The ADC 504 converts an output signal (i.e., analog information) from the tuner 503 into digital information. The demodulating circuit 505 demodulates the digital information supplied from the ADC 504.

The TS decoder 506 performs a TS decoding process on the output signal supplied from the demodulating circuit 505 to separate audio information and video information. The audio decoder 511 decodes the audio information from the TS decoder 506. The DAC 512 converts the output signals from the audio decoder 511 into analog signals.

The audio outputting circuit 513 receives the output signal supplied from the DAC 512, and then outputs the output signal to the speaker 514. The video decoder 521 decodes the video information supplied from the TS decoder 506. The video and OSD synthesizing circuit 522 synthesizes the output signal supplied from the video decoder 521 and the output signal supplied from the OSD drawing circuit 525.

The video outputting circuit 523 receives the output signal supplied from the video and OSD synthesizing circuit 522, and then outputs the output signal to the display device 524. The OSD drawing circuit 525 includes a character generator for displaying characters and figures on the screen of the display device 524. The OSD drawing circuit 525 generates a signal including display information in response to an instruction from the operation device 532 or the IR optical receiver 551.

Audio-Visual (AV) data and other data are temporarily accumulated in the memory 531. The operation device 532 includes an input medium, not illustrated, which is an example of a control panel. The operation device 532 informs the main controller 501 of various types of information that have been input by a user. The drive IF 541 may be a bidirectional communication interface. Such an interface complies with AT Attachment Packet Interface (AT-API), for example.

The hard disk device 542 includes a hard disk, and a driving device configured to drive the hard disk. The driving device records data in the hard disk, and plays the data recorded in the hard disk. The optical disk device 543 records data in an optical disk (e.g., DVD), and plays the data recorded in the optical disk.

The IR optical receiver 551 receives an optical signal from a remote control transmitter 620, and informs the main controller 501 of the received optical signal. The communication controller 552 controls communication with the Internet. The television apparatus 500 is capable of acquiring various types of information through the Internet.

Figure 8:
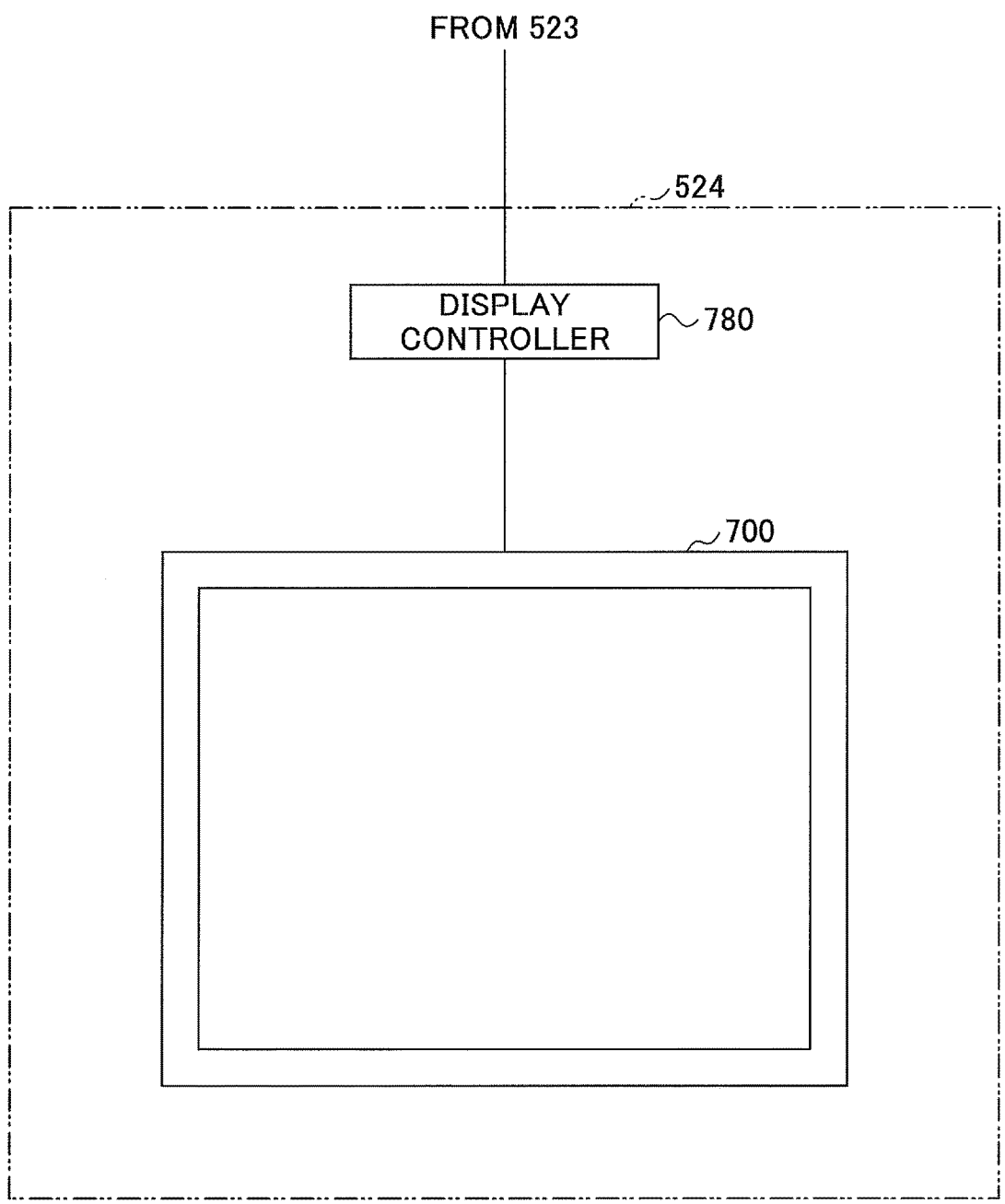
FIG. 8 illustrates the television apparatus in the second embodiment.
Figure 9:
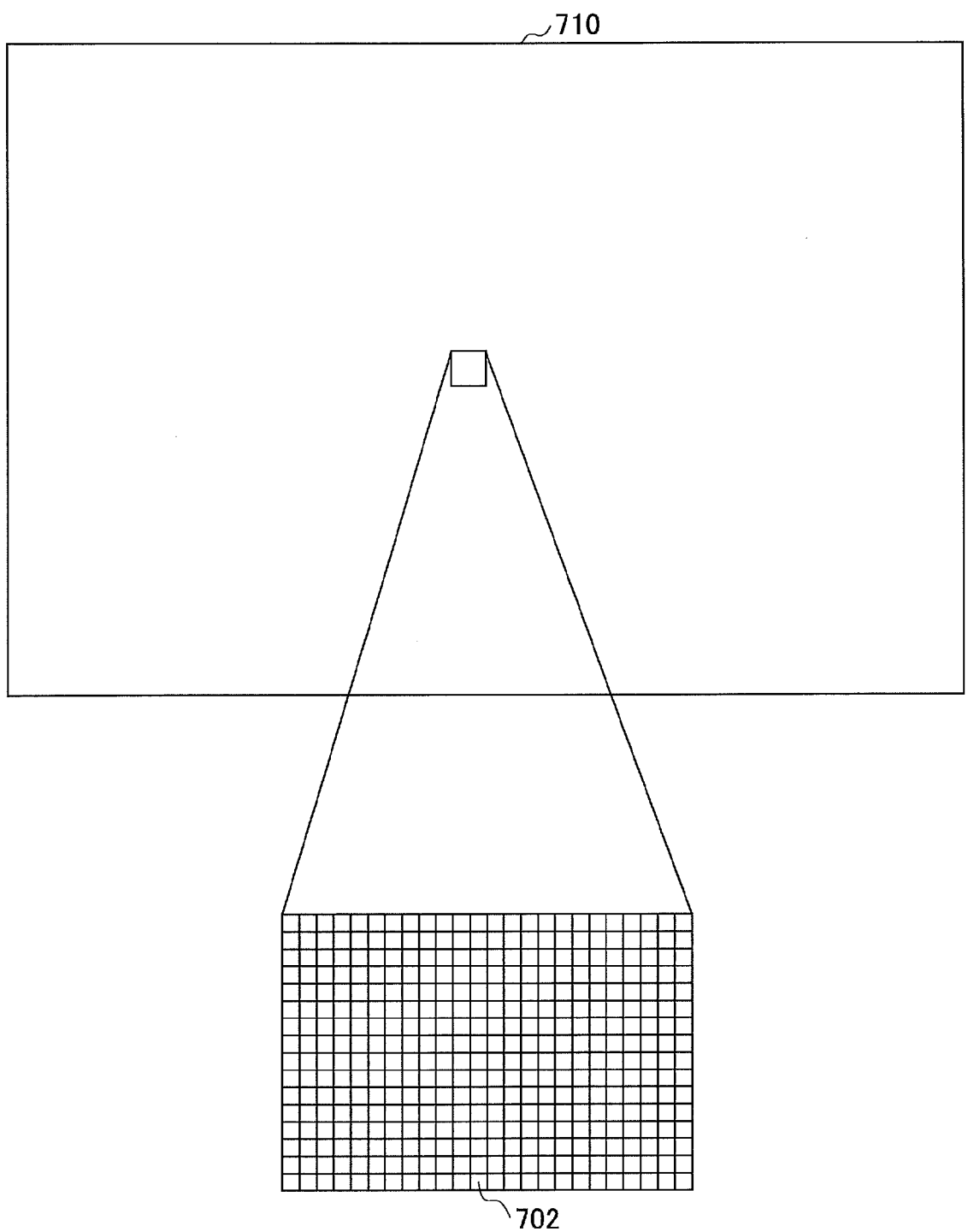
FIG. 9 illustrates the television apparatus in the second embodiment.

As illustrated in FIG. 8, as an example, the display device 524 includes a display unit 700 and a display controller 780. As illustrated in FIG. 9, as an example, the display unit 700 includes a display 710. In the display 710, a plurality of display elements 702 are arranged in a matrix (here, the number of the display elements 702 can be represented by n×m).

Figure 10:
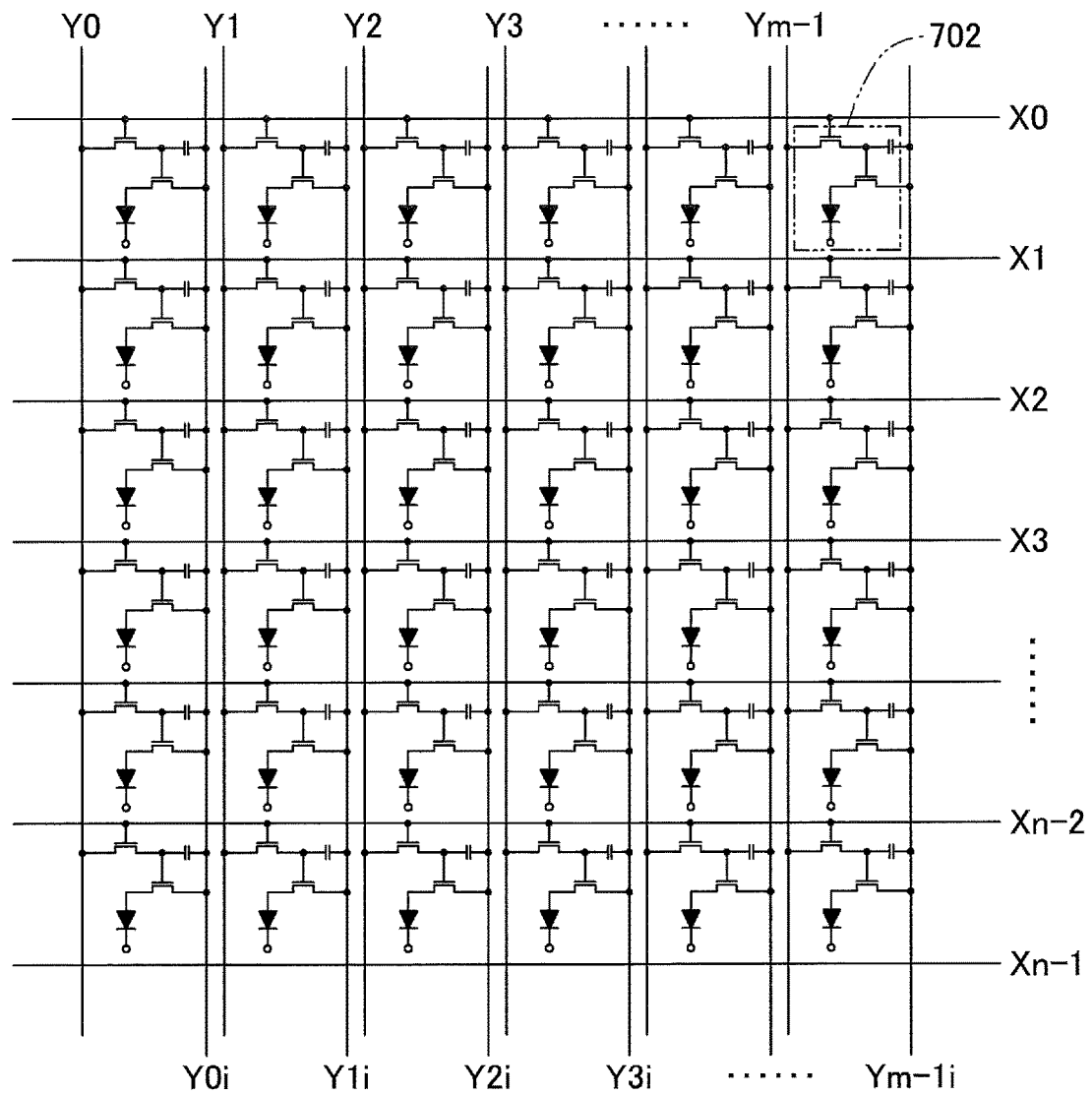
FIG. 10 illustrates the television apparatus in the second embodiment.
Figure 10:
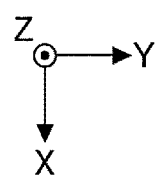

As illustrated in FIG. 10, as an example, the display 710 includes n scanning lines (X0, X1, X2, X3, . . . , Xn−2, Xn−1), m data lines (Y0, Y1, Y2, Y3, . . . , Ym−1), and m current supplying lines (Y0i, Y1i, Y2i, Y3i, . . . , Ym−1i). The n scanning lines are arranged at equal interval in X-axis direction. The m data lines are arranged at equal interval in Y-axis direction. The m current supplying lines are arranged at equal interval in Y-axis direction. Each one of the display elements 702 can be identified by the scanning line and the data line.

Figure 11:
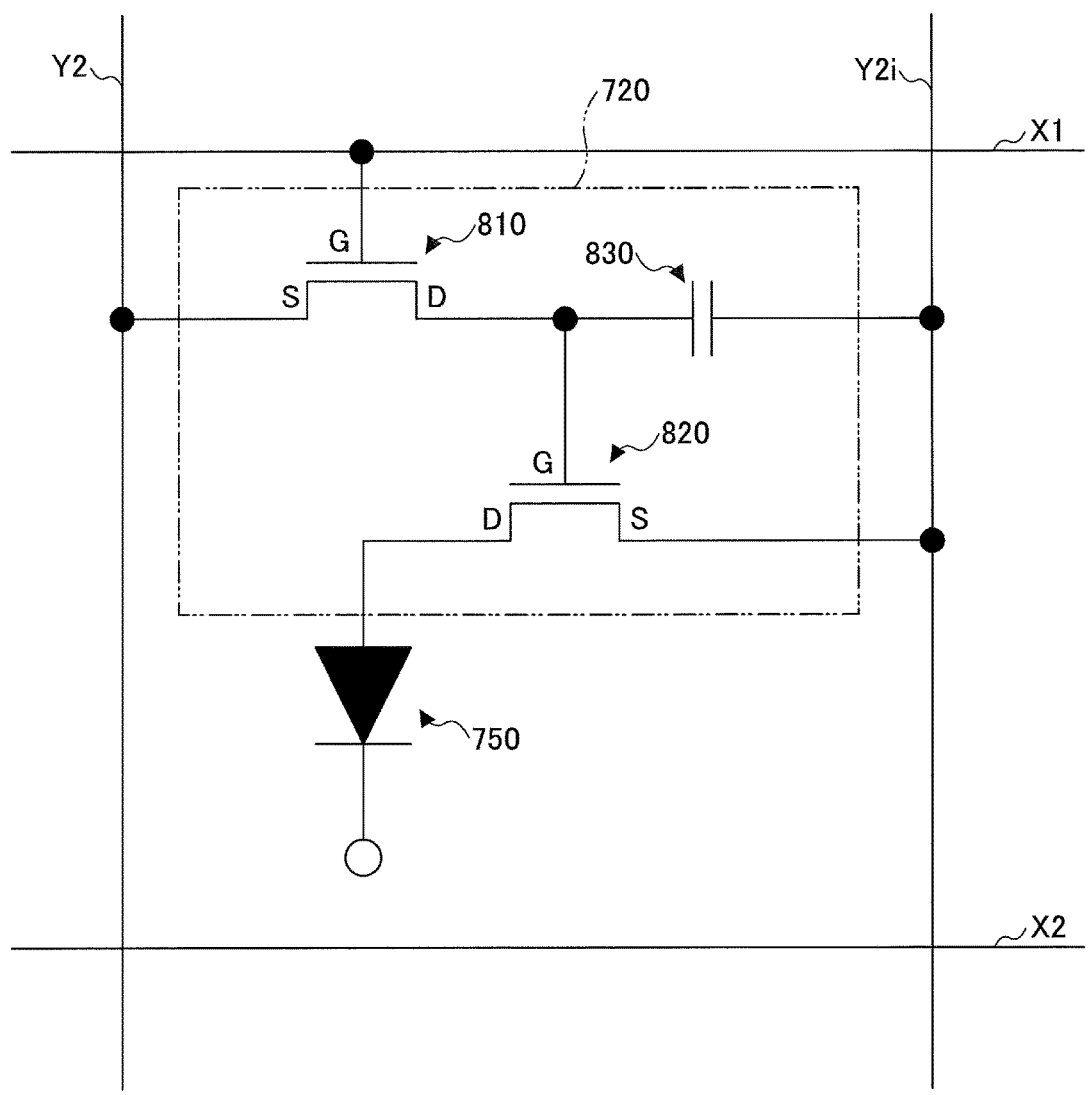
FIG. 11 illustrates a display element in the second embodiment.

As illustrated in FIG. 11, as an example, each one of the display elements 702 includes an organic electroluminescence (EL) element 750, and a driving circuit 720 configured to cause the organic EL element 750 to emit light. In other words, the display 710 is a so-called active matrix organic EL display. In addition, the display 710 may be a color-supporting 32-inch display. The size is not limited to 32 inches.

Figure 12:
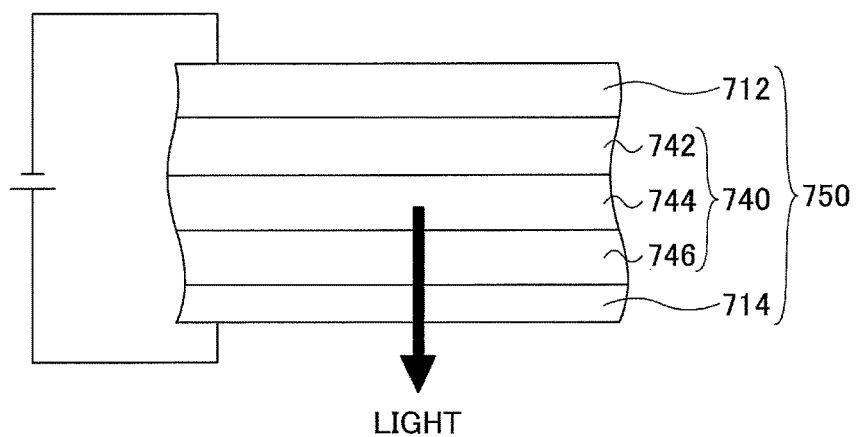
FIG. 12 illustrates an organic EL element in the second embodiment.

As illustrated in FIG. 12, as an example, the organic EL element 750 includes an organic EL thin-film layer 740, a cathode 712, and an anode 714.

The organic EL element 750 can be arranged, for example, next to the field-effect transistor. In this case, the organic EL element 750 and the field-effect transistor can be formed on an identical substrate. However, the arrangement of the organic EL element 750 is not limited to the above-described arrangement. For example, the organic EL element 750 may be arranged on the field-effect transistor. In this case, the transparency is demanded for the gate electrode. Therefore, transparent oxide having a conductive property, such as ITO, $In_2O_3$, $SnO_2$, ZnO, ZnO in which Ga is added, ZnO in which Al is added, and $SnO_2$ in which Sb is added, can be used for the gate electrode.

In the organic EL element 750, aluminum (Al) may be used for a cathode 712. Magnesium (Mg)—silver (Ag) alloy, aluminum (Al)—lithium (Li) alloy, or Indium Tin Oxide (ITO) may be used. ITO may be used for the anode 714. Oxide having a conductive property such as $In_2O_3$, $SnO_2$, or ZnO, or silver (Ag)—neodymium (Nd) alloy may be used.

The organic EL thin-film layer 740 includes an electron transporting layer 742, a light-emitting layer 744, and a hole transporting layer 746. The cathode 712 is coupled to the electron transporting layer 742, and the anode 714 is coupled to the hole transporting layer 746. When a given voltage is applied between the cathode 712 and the anode 714, the light-emitting layer 744 emits light.

As illustrated in FIG. 11, the driving circuit 720 includes two field-effect transistors 810 and 820, and a capacitor 830. The field-effect transistor 810 operates as a switching element. The gate electrode G is coupled to a given scanning line. The source electrode S is coupled to a given data line. The drain electrode D is coupled to one of the ends of the capacitor 830.

The capacitor 830 is configured to store the state of the field-effect transistor 810, that is, the capacitor 830 is configured to store data. The other one of the ends of the capacitor 830 is coupled to a given current supplying line.

The field-effect transistor 820 is configured to supply a large current to the organic EL element 750. The gate electrode G is coupled to the drain electrode D of the field-effect transistor 810. The drain electrode D is coupled to the anode 714 of the organic EL element 750. The source electrode S is coupled to a given current supplying line.

When the field-effect transistor 810 turns into ON state, the field-effect transistor 820 drives the organic EL element 750.

Figure 13:
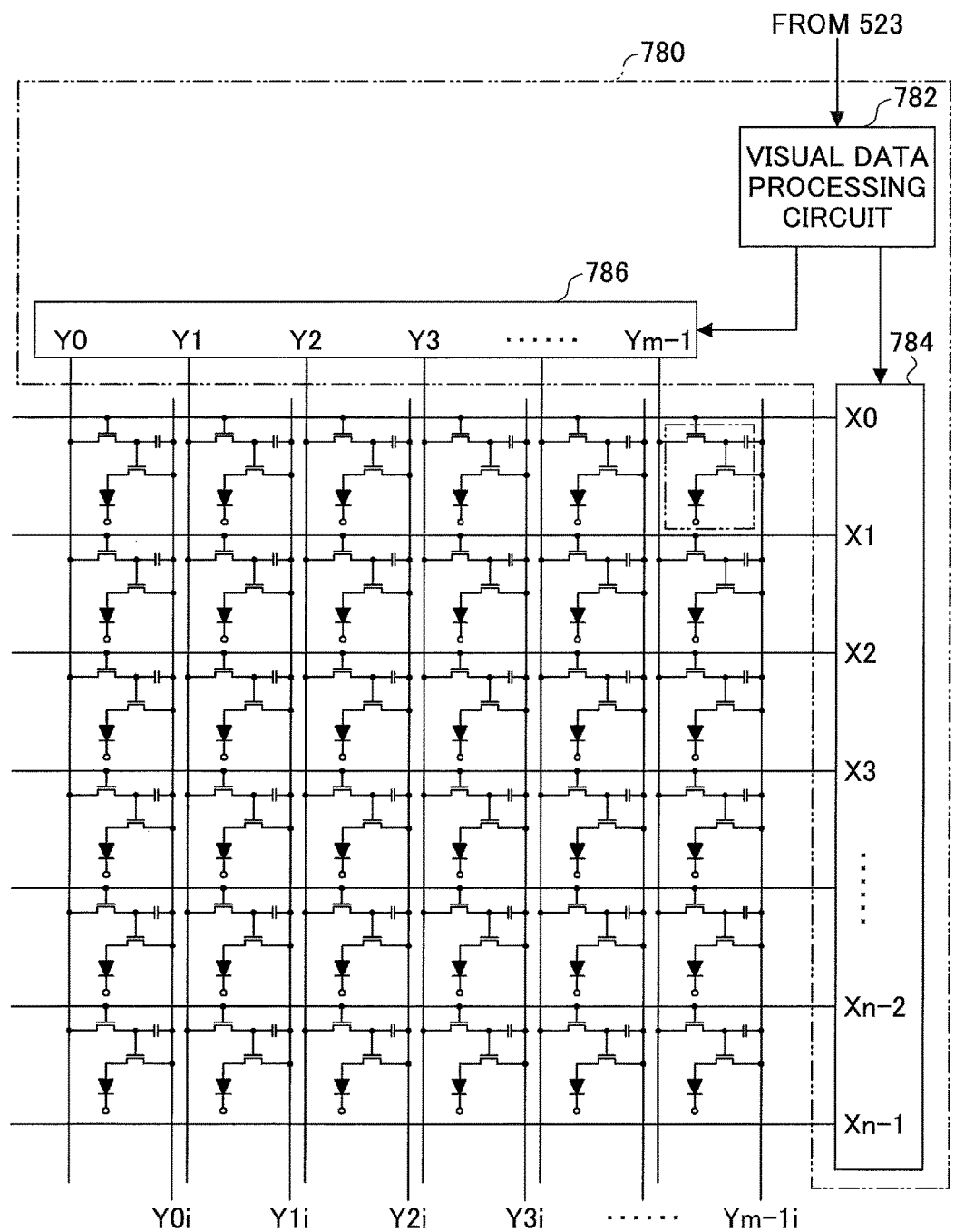
FIG. 13 illustrates the television apparatus in the second embodiment.

As illustrated in FIG. 13, as an example, the display controller 780 includes a visual data processing circuit 782, a scanning line driving circuit 784, and a data line driving circuit 786.

The visual data processing circuit 782 determines the brightness of the plurality of display elements 702 on the display 710 in accordance with the output signal supplied from the video outputting circuit 523. The scanning line driving circuit 784 individually applies voltages on the n scanning lines in response to an instruction from the visual data processing circuit 782. The data line driving circuit 786 individually applies voltages on the m data lines in response to an instruction from the visual data processing circuit 782.

As is obvious from the above description, in the television apparatus 500 in the second embodiment, the visual data creator includes the video decoder 521, the video and OSD synthesizing circuit 522, the video outputting circuit 523, and the OSD drawing circuit 525.

In the above description, the case where the optical control element is an organic EL element has been described. However, the optical control element is not limited to the organic EL element. The optical control element may be a liquid crystal element, an electrochromic element, an electrophoresis element, and an electrowetting element.

Figure 14:
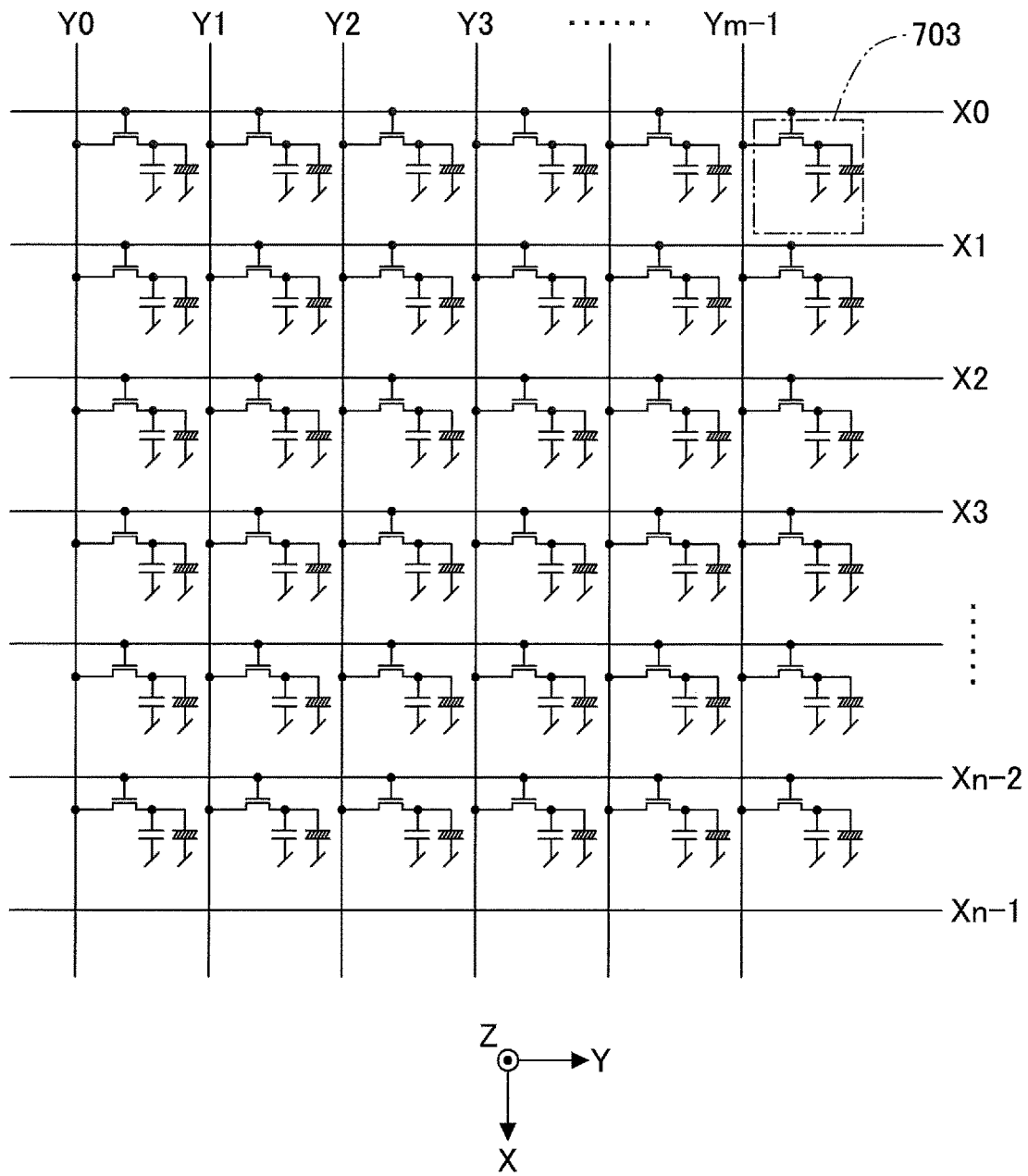
FIG. 14 illustrates another display element in the second embodiment.

In a case where the optical control element is a liquid crystal element, for example, a liquid crystal display is used for the display 710. In this case, as illustrated in FIG. 14, no current supplying line is necessary in the display element 703.

Figure 15:
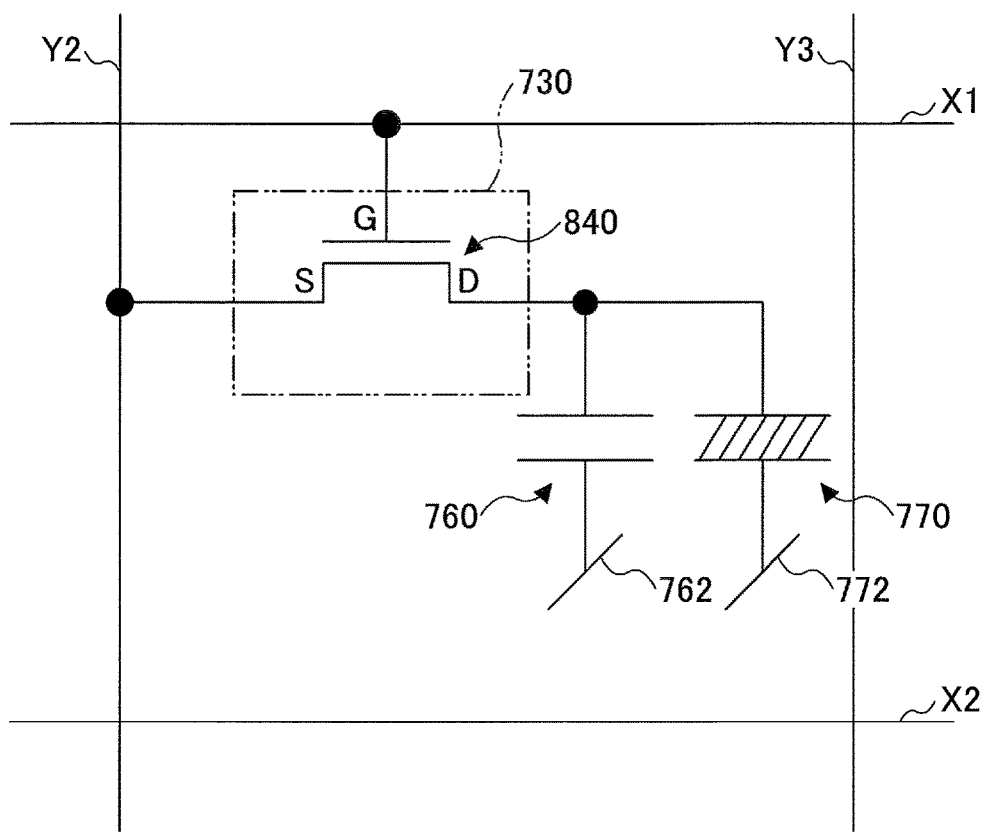
FIG. 15 illustrates yet another display element in the second embodiment.

Also in this case, as illustrated in FIG. 15, as an example, a driving circuit 730 can be configured with only one field-effect transistor 840, which has the same configuration as the configuration of the field-effect transistor 810 or 820. In the field-effect transistor 840, the gate electrode G is coupled to a given scanning line. The source electrode S is coupled to a given data line. The drain electrode D is coupled to a pixel electrode of a liquid crystal element 770 and a capacitor 760. In FIG. 15, reference numerals 762 and 772 denote opposite electrodes (i.e., common electrodes) of the capacitor 760 and the liquid crystal element 770, respectively.

In the embodiments described above, the case where the system is a television apparatus has been described. However, the embodiments are not limited to the above-described case. In short, the display device 524 can be provided for displaying videos and information. For example, a computer system in which a computer (e.g., personal computer) and the display device 524 are coupled to each other may be provided.

In addition, the display device 524 can be used for a display in a mobile information device or an image-capturing device. Examples of the mobile information device may include, but are not limited to, a mobile telephone, a mobile music player, a mobile video player, an electronic book, and a Personal Digital Assistant (PDA). Examples of the image-capturing device may include, but are not limited to, a still camera and a video camera.

Further, the display device 524 can be used for a display device that displays various types of information in a movable body system such as a vehicle, an airplane, a train, or a ship.

Furthermore, the display device 524 can be used for a display device that displays various types of information in a measuring device, analyzer, a medical device, or an advertising medium.

Heretofore, embodiments have been described in detail. However, the present invention is not limited to these embodiments, but various variations and modifications may be made without departing from the scope of the present invention.

What is claimed is:

1. A gas barrier laminate comprising:
   a substrate;
   a barrier layer formed on at least one of faces of the substrate, the barrier layer including composite oxide including silicon and alkaline-earth metal; and
   a gate insulating layer of a semiconductor device configured to be at least in partial contact with the barrier layer, wherein the composite oxide is in at least partial contact with the substrate.

2. The gas barrier laminate according to claim 1, wherein the composite oxide includes at least one of Al and B.

3. The gas barrier laminate according to claim 1, wherein the substrate has a flexible property.

4. A semiconductor device comprising:
   the gas barrier laminate of claim 1;
   a gate electrode configured to apply a gate voltage;
   a source electrode and a drain electrode configured to make electrical current available in accordance with applying of the gate voltage; and
   an active layer configured to form a channel between the source electrode and the drain electrode,
   the gate insulating layer being arranged between the active layer and the gate electrode, and
   the gate electrode, the source electrode, the active layer, and the gate insulating layer being arranged on the barrier layer of the gas barrier laminate.

5. The semiconductor device according to claim 4, wherein the barrier layer and the gate insulating layer have an identical composition.

6. A display element comprising:
   the semiconductor device of claim 4;
   a driving circuit configured to output a driving signal; and
   an optical control element configured to control an optical output in response to the driving signal output from the driving circuit,
   wherein the driving circuit drives the optical control element by the semiconductor device.

7. The display element according to claim 6, wherein the optical control element includes one of an electroluminescence element, an electrochromic element, a liquid crystal element, an electrophoresis element, and an electrowetting element.

8. A display device comprising:
   a display unit including a plurality of the display elements of claim 6 arranged in a matrix; and a display controller configured to individually control the plurality of the display elements.

9. A system comprising:

the display device of claim 8; and a visual data creator configured to supply the display device with visual data.

* * * * *